(12) United States Patent
Usui et al.

(10) Patent No.: US 6,617,083 B2
(45) Date of Patent: Sep. 9, 2003

(54) METHOD OF CORRECTING MASK PATTERNS

(75) Inventors: Satoshi Usui, Ooita (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/985,810

(22) Filed: Nov. 6, 2001

(65) Prior Publication Data

US 2002/0058187 A1 May 16, 2002

(30) Foreign Application Priority Data

Nov. 7, 2000 (JP) ........................................ 2000-339332

(51) Int. Cl.[7] ................................................. G03F 9/00
(52) U.S. Cl. ............................................. 430/5; 430/30
(58) Field of Search ........................................ 430/5, 30

(56) References Cited

U.S. PATENT DOCUMENTS 6,136,478 A  * 10/2000 Usui et al. ...................... 430/5

OTHER PUBLICATIONS

Hashimoto et al., "Accurate Proximity Correction Method with Total Process Proximity–Based Correction Factor (TCF)," Proceeding of SPIE (Feb. 25, 1998), 3334:224–233.

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

A mask pattern correction method, a photomask produced according to the method, and a storage medium storing a program to execute the method are disclosed. The method includes preparing pattern density-based correction data according to differences between mask patterns and patterns actually formed on a wafer by photolithography using the mask patterns, obtaining design patterns for a correction target area defined on a mask, calculating a density of the design patterns in the correction target area, retrieving correction data corresponding to the calculated density from the prepared pattern density-based correction data, and correcting the design patterns for the correction target area according to the retrieved correction data.

30 Claims, 11 Drawing Sheets

PATTERN TO CORRECT 110

DESIGN PATTERN 111
SIMULATED PATTERN 112
SIMULATION RANGE Sa

CORRECTED MASK PATTERN 113

PATTERN DENSITY = x%

PATTERN SIZE ON WAFER

OPE CURVE

DESIGN SIZE

DISTANCE TO ADJACENT PATTERN

CORRECTION TABLE FOR PATTERN DENSITY OF x%

| DISTANCE TO ADJACENT PATTERN | CORRECTION QUANTITY /ONE SIDE |
|---|---|
| s ≦ a | 0 |
| a < s ≦ b | −A |
| b < s ≦ c | −2A |
| c < s ≦ d | −3A |
| d < s ≦ e | −4A |
| e < s | −5A |

CORRECTION TABLES FOR
VARIOUS PATTERN DENSITIES

PATTERN DENSITY: 40%
PATTERN DENSITY: 30%
PATTERN DENSITY: 20%
PATTERN DENSITY: 10%

| DISTANCE TO ADJACENT PATTERN | CORRECTION QUANTITY /ONE SIDE |
|---|---|
| $s \leq a$ | 0 |
| $a < s \leq b$ | $-A$ |
| $b < s \leq c$ | $-2A$ |
| $c < s \leq d$ | $-3A$ |
| $d < s \leq e$ | $-4A$ |
| $e < s$ | $-5A$ |

EXPOSURE SHOT AREA A1

A2   A2

A1

A2   A2

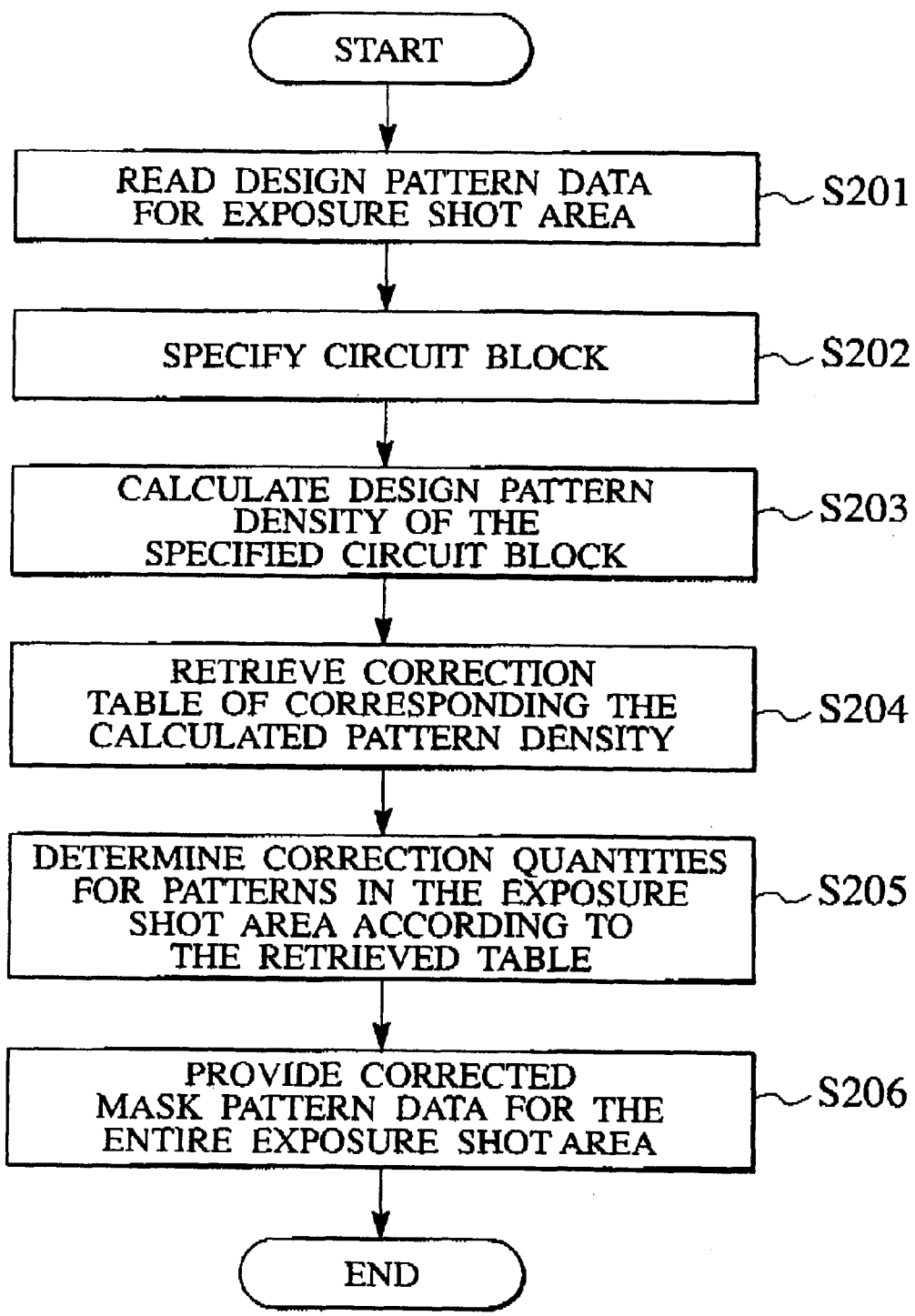

METHOD OF CORRECTING MASK PATTERNS

CROSS REFERENCE TO RELATED APPLICATIONS

This application is based upon and claims the benefit of priority from the prior Japanese Patent Application No. 2000-339332 filed on Nov. 7, 2000, the entire contents of which are incorporated herein by reference.

BACKGROUND OF THE INVENTION

1. Field of the Invention

The present invention relates to a method of correcting patterns to be formed on a photomask used for photolithography in semiconductor device manufacturing, a photomask with corrected patterns, and a computer-readable storage medium storing a mask pattern correcting program.

2. Description of the Related Art

To provide finer semiconductor devices, finer patterns must be formed on a wafer by photolithography employing a photomask and an optical projection system.

If the optical projection system has sufficient resolution for original patterns designed for a semiconductor device (such original patterns as designed are hereinafter referred to as the "design patterns"), patterns formed on a photomask (sometimes simply referred to as a "mask") may exactly be faithful to the design patterns, to form the design patterns on a wafer by photolithography using the photomask. If the design patterns are too fine for the resolution of the optical system and if they are exactly formed on a photomask, the photomask will form thinned or thickened patterns on a wafer due to an optical proximity effect (OPE). In this case, the patterns on the wafer are unfaithful to the design patterns.

To cope with this problem, an optical proximity correction (OPC) has been carried out on mask patterns.

FIG. 1 shows an exposure shot area A on a photomask. The exposure shot area is an area of a photomask that is exposed to a shot of light during a photolithography process to print patterns on a wafer through the photomask. To carry out the optical proximity correction on a line pattern in the exposure shot area A, rule-based correction or simulation-based correction is employed.

FIGS. 2A to 2C explain a rule-based correction technique. In FIG. 2A, a correction target pattern 100 is surrounded by peripheral patterns with certain distances between them. The rule-based correction prepares, in advance, a correction table showing relationships between pattern-to-pattern distances and correction quantities. This correction table is arranged based on tests that measure differences between design patterns and corresponding actual patterns formed on a wafer.

In FIG. 2B, a design pattern 101 depicted with a dotted line has a distance S from an adjacent pattern. If the design pattern 101 is faithfully formed on a mask, it will project a thinned pattern 102 on a wafer due to the optical proximity effect when the wafer is exposed to light through the mask. The rule-based correction retrieves a correction quantity B from the above-mentioned correction table according to the pattern-to-pattern distance S and adds the retrieved correction quantity B to the design pattern 101, to form a corrected pattern 103 on a photomask as shown in FIG. 2C.

FIGS. 3A to 3C explain a simulation-based correction technique. FIG. 3A shows a correction target pattern 110. FIG. 3B shows a design pattern 111 corresponding to the pattern 110. A simulation range Sa of several micrometers is defined around the design pattern 111. In the simulation range Sa, a simulation is carried out to simulate a pattern 112 as a pattern to be actually formed on a wafer by photolithography. The difference between the design pattern 111 and the simulated pattern 112 is a correction quantity. Based on the correction quantity, a corrected pattern 113 is formed on a photomask as shown in FIG. 3C.

The related arts mentioned above employ a correction target pattern and a small peripheral area of several micrometers around the correction target pattern to cope with the optical proximity effect.

According to recent studies, circuit patterns formed by photolithography including exposing, developing, and etching processes are thinned or thickened not only by conditions in a peripheral area of several micrometers square but also by conditions in a wider peripheral area of several hundreds to thousands of micrometers square. As a result, the related arts are improper to correctly form patterns as designed on a wafer.

SUMMARY OF THE INVENTION

A first aspect of the present invention provides a method of correcting mask patterns. The method obtains pattern correction quantities according to differences between mask patterns and patterns actually formed on a wafer by photolithography using the mask patterns, prepares pattern density-based correction data from the obtained pattern correction quantities, obtains design patterns for a correction target area defined on a mask, calculates a density of the design patterns in the correction target area, retrieves correction data corresponding to the calculated density from the pattern density-based correction data, and corrects the design patterns for the correction target area according to the retrieved correction data.

A second aspect of the present invention provides a method of correcting mask patterns. The method prepares pattern density-based correction data like the first aspect, obtains design patterns for an exposure shot area defined on a mask, calculates a density of design patterns for a discrete circuit block requiring a highest pattern accuracy in the exposure shot area, retrieves correction data corresponding to the calculated density from the pattern density-based correction data, and corrects the design patterns for the correction target area according to the retrieved correction data.

A third aspect of the present invention provides a method of correcting mask patterns. The method prepares pattern density-based correction data like the first aspect and obtains design patterns for a correction target area defined on a mask and design patterns for a peripheral area defined around the correction target area. The "peripheral area" is an area whose pattern density affects pattern sizes in the correction target area. The method calculates a density of the design patterns for the correction target area and a density of the design patterns for the peripheral area, calculates an effective pattern density for the correction target area according to the calculated two densities, retrieves correction data corresponding to the effective pattern density from the pattern density-based correction data, and corrects the design patterns for the correction target area according to the retrieved correction data.

A fourth aspect of the present invention produces a photomask according to the method of the first aspect.

A fifth aspect of the present invention produces a photomask according to the method of the first aspect.

A sixth aspect of the present invention produces a photomask according to the method of the third aspect.

A seventh aspect of the present invention provides a computer-readable memory storing a program to execute the method of the first aspect. The program includes reading design patterns to be contained in a correction target area defined on a mask, calculating a density of the design patterns in the correction target area, retrieving correction data corresponding to the calculated density from pattern density-based correction data prepared in advance according to differences between mask patterns and patterns actually formed on a wafer by photolithography using the mask patterns, and correcting the design patterns to be contained in the correction target area according to the retrieved correction data.

An eighth aspect of the present invention provides a computer-readable memory storing a program to execute the method of the second aspect. The program includes reading design patterns for a correction target area defined on a mask, calculating a density of design pattern for a circuit block requiring a highest pattern accuracy in the correction target area, retrieving correction data corresponding to the calculated density from pattern density-based connection data prepared in advance according to differences between mask patterns and patterns actually formed on a wafer by photolithography using the mask patterns, and correcting the design patterns for the correction target area according to the retrieved correction data.

A ninth aspect of the present invention provides a computer-readable memory storing a program to execute the method of the third aspect. The program includes obtaining design patterns for a correction target area defined on a mask and design patterns for a peripheral area defined around the correction target area, calculating a density of the design patterns for the correction target area and a density of the design patterns for the peripheral area, calculating an effective pattern density for the correction target area according to the calculated two densities, retrieving correction data corresponding to the effective pattern density from pattern density-based correction data prepared in advance according to differences between mask patterns and patterns actually formed on a wafer by photolithography using the mask patterns, and correcting the design patterns for the correction target area according to the retrieved correction data.

BRIEF DESCRIPTION OF THE DRAWINGS

FIG. 10 is a flowchart showing the mask pattern correction method according to the second embodiment.

DETAILED DESCRIPTION OF EMBODIMENTS

First Embodiment

A mask pattern correction method according to the first embodiment will be explained with reference to the drawings. This method divides an exposure shot area on a mask into uniform sub-areas and corrects patterns in each of the subareas according to a density of the patterns in the sub-area.

As a preparation for starting rule-based or simulation-based correction of mask patterns, the first embodiment prepares pattern correction data as shown in FIGS. 4A to 6B.

Figure 1:
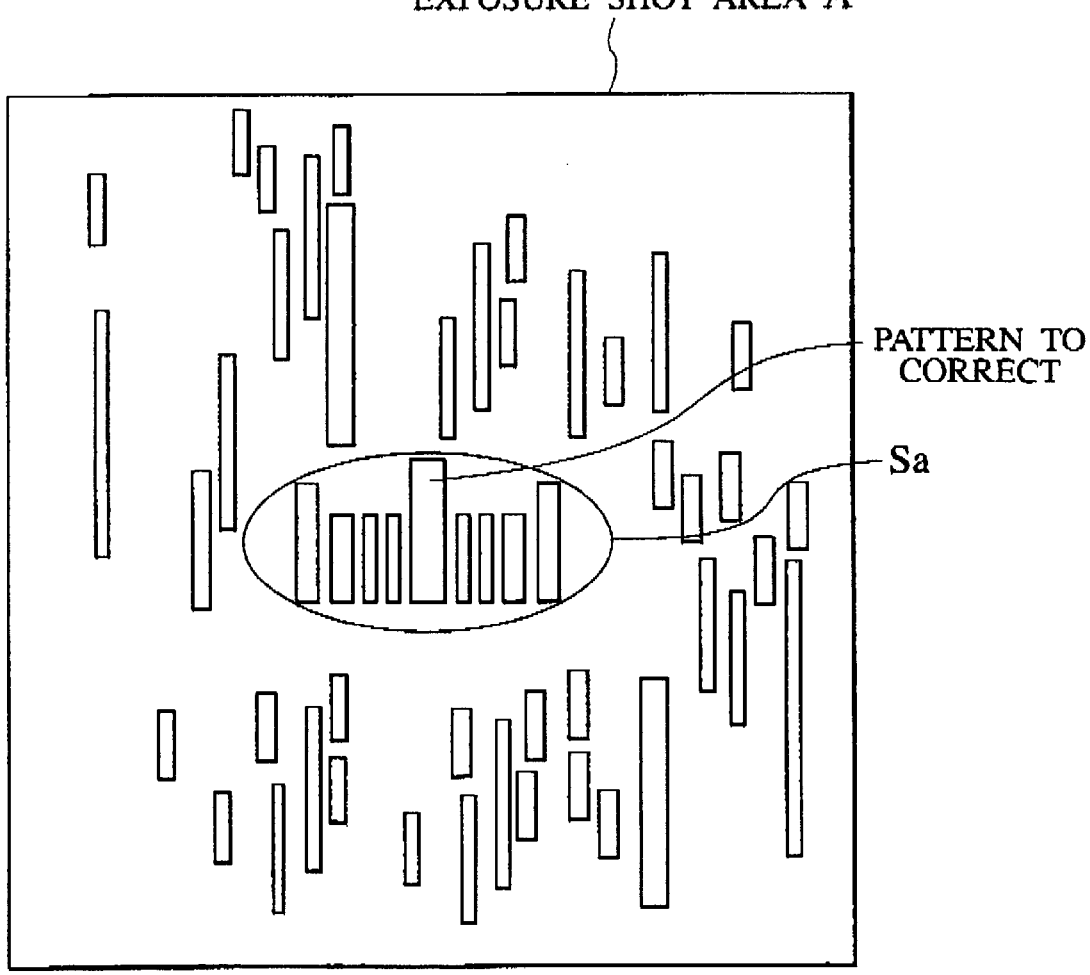
FIG. 1 is a plan view showing an exposure shot area and a correction target pattern on a mask according to a related art.
Figure 2A:
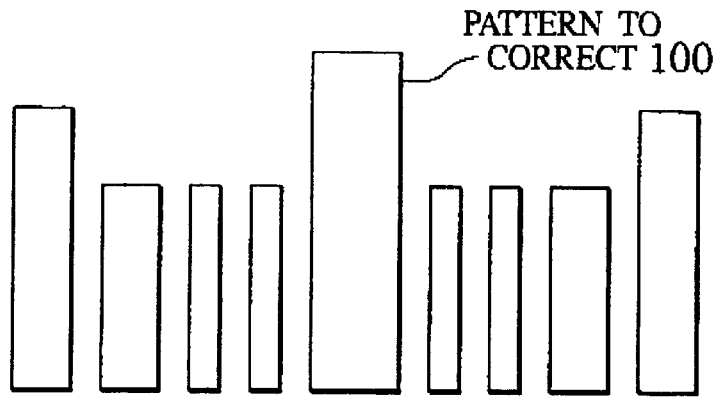
FIGS. 2A to 2C are plan views showing a rule-based correction technique according to a related art.
Figure 2B:
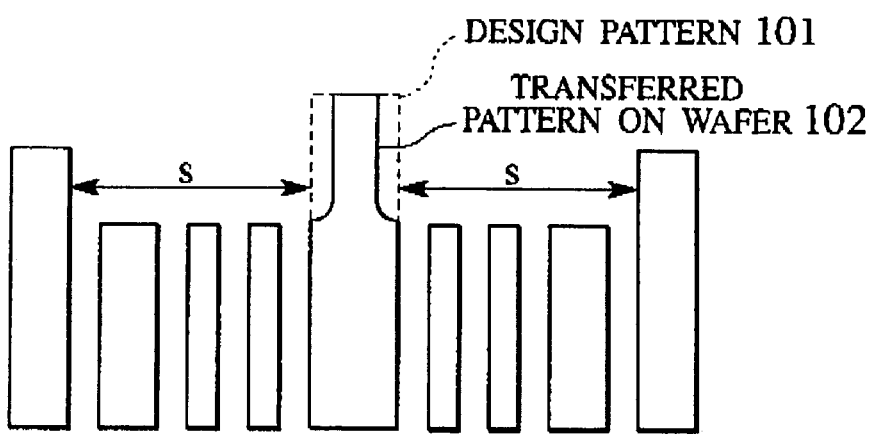
Figure 2C:
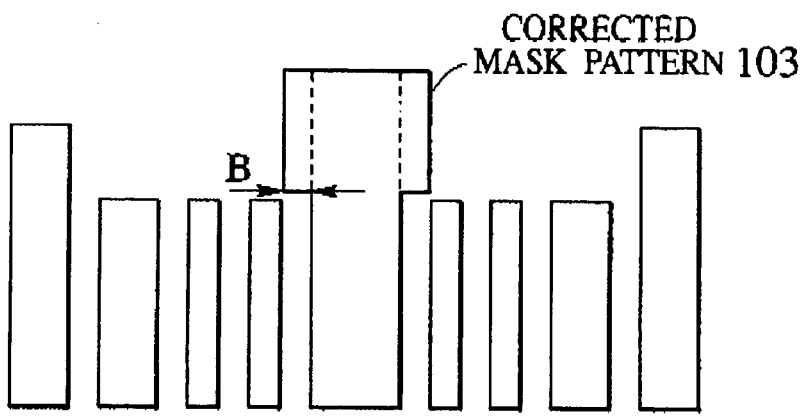
Figure 3A:
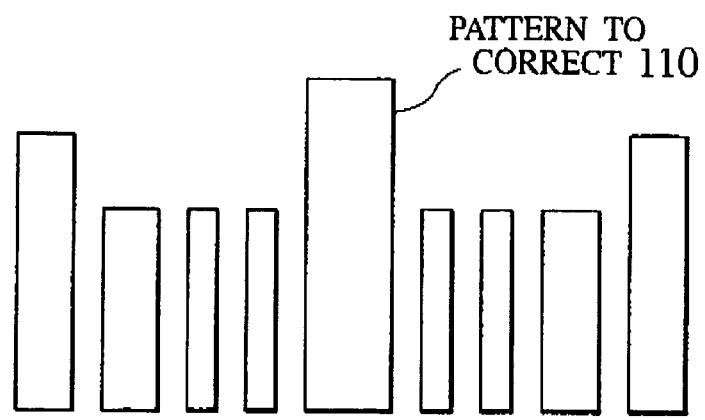
FIGS. 3A to 3C are plan views showing a simulation-based correction technique according to a related art.
Figure 3B:
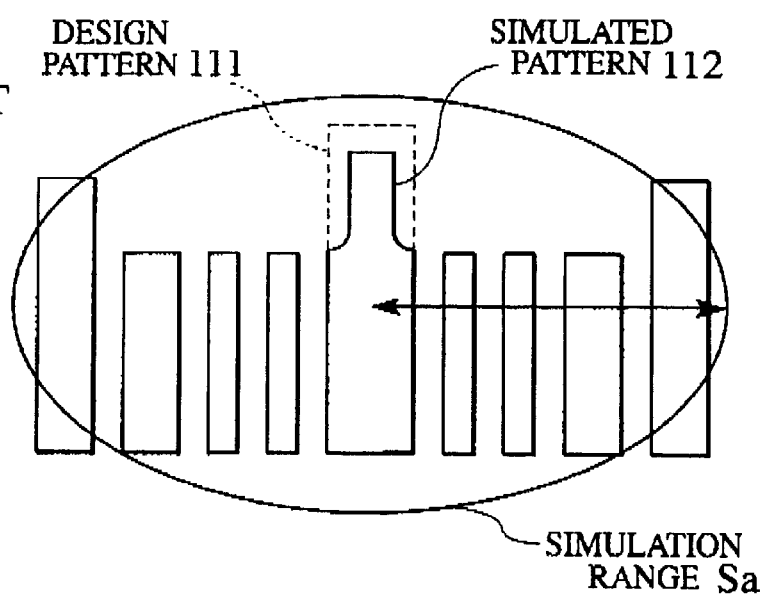
Figure 3C:
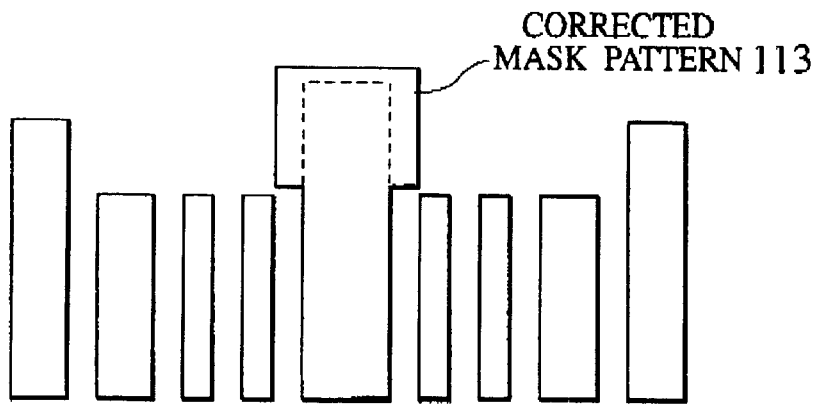
Figures 4A, 4B:
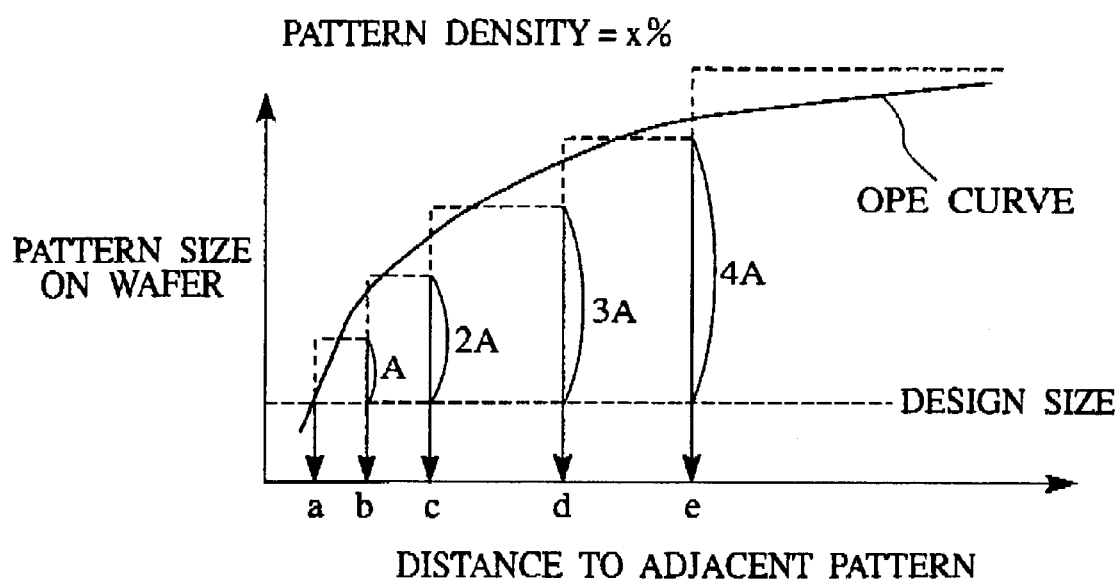
FIG. 4A is a graph showing an OPE curve used for rule-based correction according to a first embodiment of the present invention.
FIG. 4B is a table of correction data prepared from the graph of FIG. 4A.

FIGS. 4A to 5B explain pattern correction data for rule-based correction according to the first embodiment. Firstly, design patterns are actually formed on a photomask, and the photomask is used to form test patterns on a wafer by photolithography involving exposing, developing, and etching processes from the design patterns on the mask and the test patterns on the wafer, relationships between pattern-to-pattern distances and actual pattern sizes are obtained as shown in FIG. 4A. The test patterns on the wafer are affected by the optical proximity effect (OPE) during the exposing process, to change the pattern sizes depending on pattern-to-pattern distances as shown in FIG. 4A. The curve shown in FIG. 4A is called an OPE curve. In practice, the pattern sizes are affected not only by the exposing process but also by the developing, etching, and other photolithography processes. Differences between the wafer pattern sizes and the design pattern sizes along the OPE curve are correction quantities applied to the design patterns to be formed on a mask.

The pattern-to-pattern distances along an abscissa of the OPE curve of FIG. 4A are classified into several groups and a correction data table of FIG. 4B is prepared. This table shows the distance groups, i.e., line rules and corresponding correction quantities.

A correction target pattern (line) has a distance "s" to an adjacent pattern. If the distance "s" is shorter than or equal to "a", a correction quantity applied to the target pattern is zero. If the distance "S" is longer than "a" and shorter than or equal to "b", a correction quantity of "–A" is added to the adjacent pattern side of the target pattern. If the distance s is longer than "b" and shorter than or equal to "c", a correction quantity of "–2A" is added to the adjacent pattern one side of the target pattern.

Figures 5A, 5B:
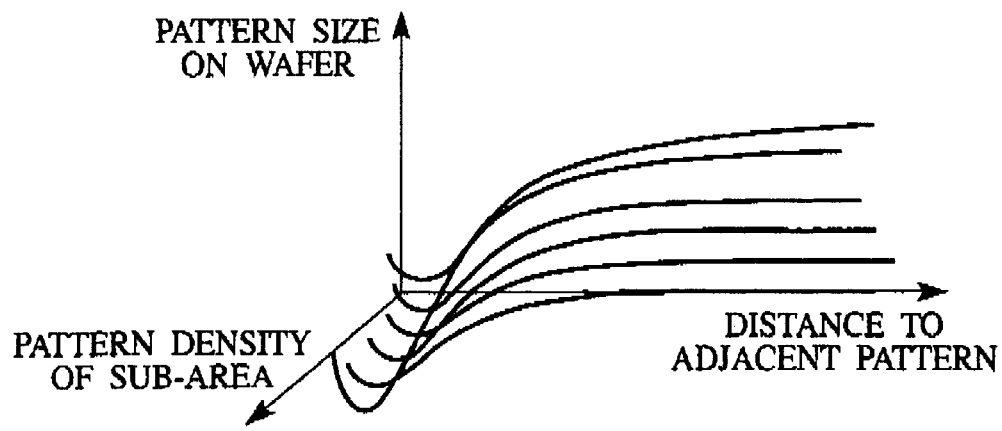
FIG. 5A is a graph showing OPE curves for different pattern densities used for the rule-based correction according to the first embodiment.
FIG. 5B shows tables of correction data prepared from the graph of FIG. 5A.

The graph and table of FIGS. 4A and 4B are for a pattern density of X %. The correction method of the first embodiment prepares several correction data tables for different pattern densities as shown in FIGS. 5A and 5B. To achieve this, test patterns with different pattern densities are actually funned on a wafer by photolithography, and based on the test patterns, OPE curves corresponding to the different pattern densities are prepared as shown in FIG. 5A. Based on the OPE curves, correction data tables for rule-based correction are prepared as shown in FIG. 5B. For example, tables of FIG. 5B are prepared for different pattern densities at intervals of 10%.

Figure 6A:
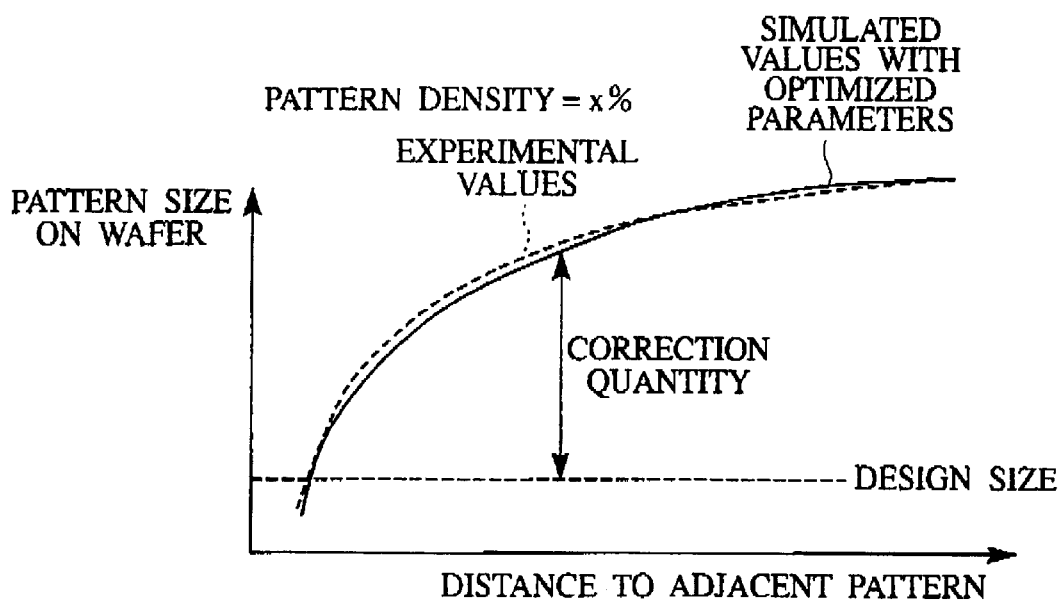
FIG. 6A is a graph showing an OPE curve used for simulation-based correction according to the first embodiment of the present invention.
Figure 6B:
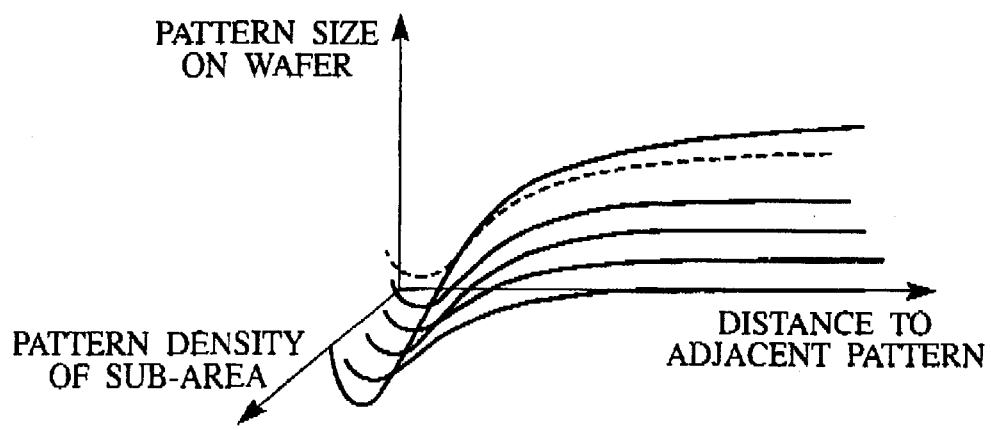
FIG. 6B is a graph showing simulated OPE curves for different pattern densities.

FIGS. 6A and 6B show simulation-based correction according to the first embodiment. Based on a given pattern density and different pattern-to-pattern distances, patterns to be formed on a wafer by photolithography are simulated, and according to the simulated patterns, an OPE curve is plotted. This OPE curve is optimized by adjusting simulation parameters, so that the OPE curve may follow values obtained from tests, as shown in FIG. 6A.

FIG. 6B shows OPE curves for different pattern densities, having optimized simulation parameters. The optimized simulation parameters are stored and used to simulate correction quantities for mask patterns having a given density.

The correction data and tables prepared as shown in FIGS. 4A to 6B are stored in a storage medium such as a computer-readable disk.

A method of correcting mask patterns according to the first embodiment using the above-mentioned correction data and tables will be explained with reference to the flowchart of FIG. 7. Steps shown in FIG. 7 may be compiled into a computer program, which may be stored in a computer-readable storage medium and may be executed by computer.

Figure 7:
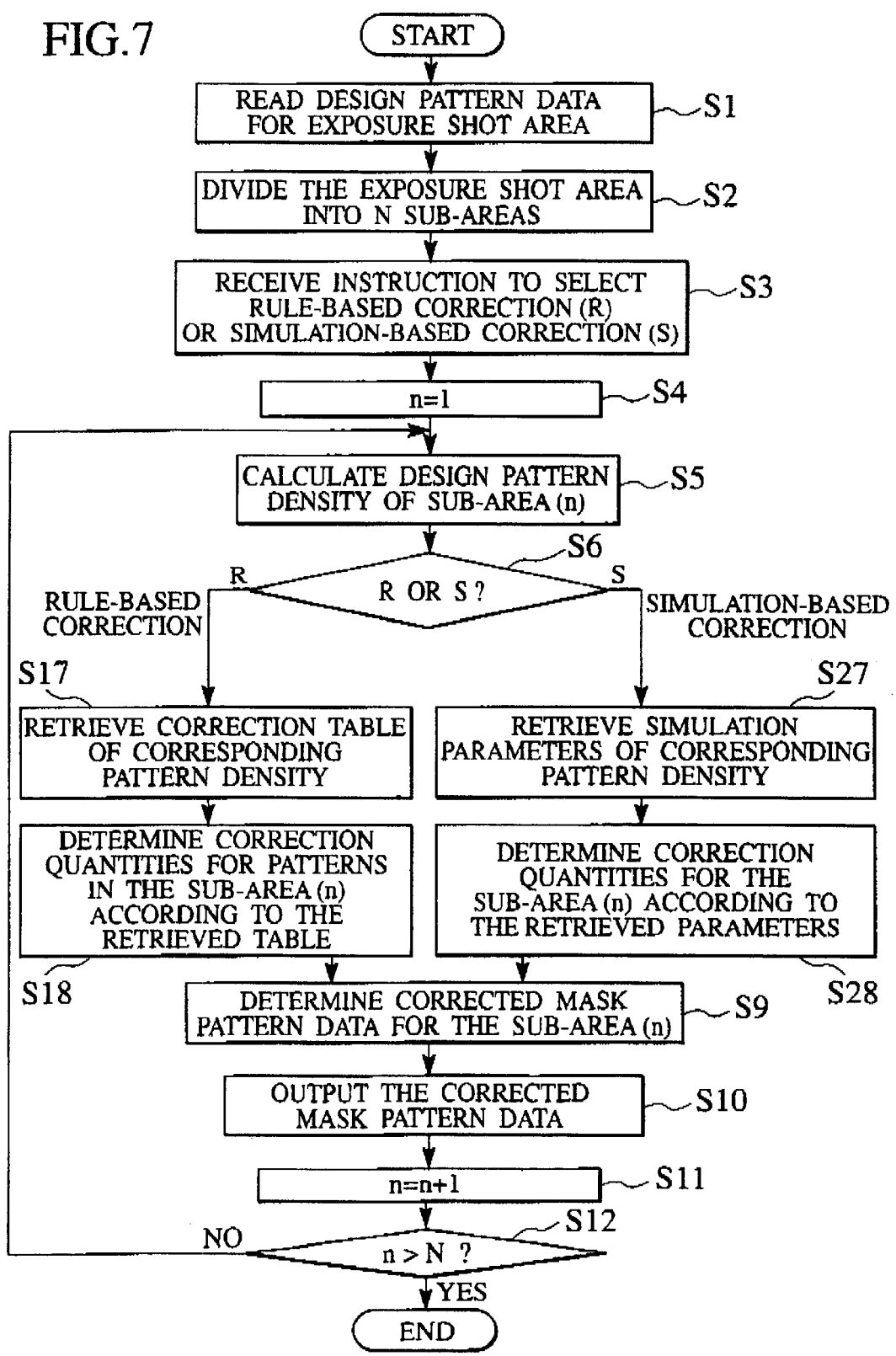
FIG. 7 is a flowchart showing a mask pattern correction method according to the first embodiment.

In FIG. 7, step S1 obtains design patterns to be contained in an exposure shot area defined on a mark each exposure shot area contains mask patterns that are transferred onto a wafer with a shot of light during an exposing process. A computer terminal may read required design patterns from a storage medium or from a server through, for example, a communication line. Design patterns for a plurality of exposure shot areas on a mask may simultaneously be read, if required.

Figure 8:
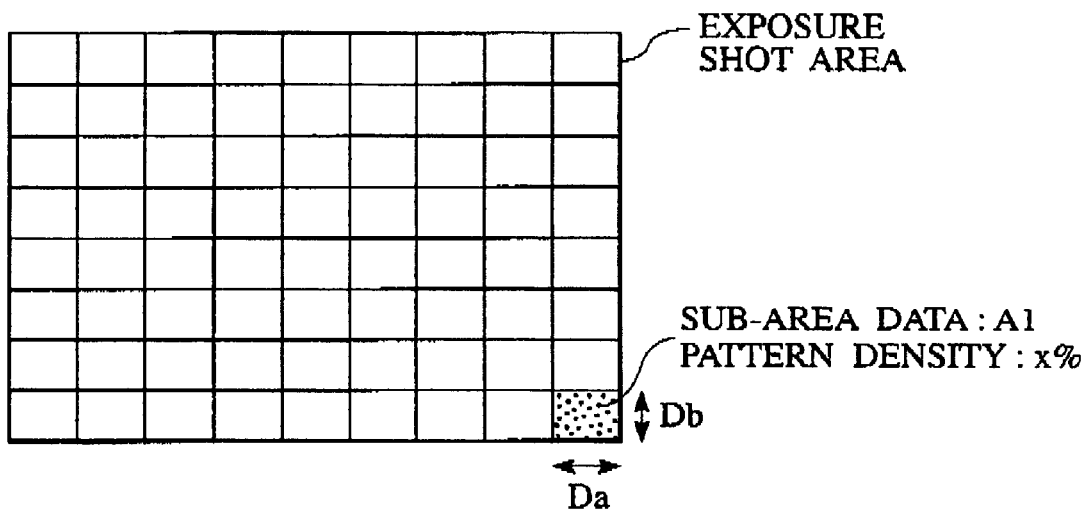
FIG. 8 is a plan view showing a correction target sub-area defined in an exposure shot area on a mask according to the first embodiment.

Step S2 divides the exposure shot area into N sub-areas. FIG. 8 shows an example of an exposure shot area divided into sub-areas. This example divides the exposure shot area into uniform sub-areas each having dimensions of Da by Db. The number N of the sub-areas is not particularly limited. For example, an exposure shot area of 25000? m by 33000? m may be divided into sub-areas each of one hundred to several thousands of micrometers square. For example, the number of sub-areas is determined such that each sub-area is about 400 micrometers square. Step Si may read design patterns for each of the sub-areas that have already been divided from an exposure shot area.

Next, Step S3 receives an instruction from a terminal operator whether the correction to be carried out is rule-based (R) or simulation-based (S). This step may be carried out before reading the design patterns.

Correction is sequentially carried out on the sub-areas.

Step S4 sets n=1. Step S5 calculates a density of the design patterns to be contained in the sub-area n(=1).

Step S6 determines whether the instructed correction is rule-based (R) or simulation-based (S). If the instructed correction is rule-based, steps S17 and S18 are carried out. If the instructed correction is simulation-based, steps S27 and S28 are carried out.

If the instructed correction is rule-based, step S17 retrieves a correction data table corresponding to the pattern density in the sub-area n from rule-based correction data tables stored in a memory. According to the retrieved correction data table, step S18 determines a correction quantity for each pattern in the sub-area n.

If the instructed correction is simulation-based, step S27 retrieves simulation parameters corresponding to the pattern density in the sub-area n from simulation-based correction data. According to the retrieved simulation parameters, step S28 calculates correction quantities for patterns in the sub-area n.

Step S9 corrects each pattern in the sub-area n according to the correction quantities obtained based on the instructed correction. Step S10 outputs corrected patterns for the sub-area n to, for example, a display or a printer. The corrected patterns with a sub-area identification number may be written into a terminal buffer memory or a storage medium.

Step S11 sets n+n 1. Step S12 checks to see if n is greater than the number N of the sub-areas. If n is smaller than or equal to N, the flow returns to step S5, and steps S5 to S12 are repeated on the new sub-area n. If each of the N sub-areas is provided with corrected patterns, the mask pattern correction ends.

Generally, a photomask is formed by directly transferring patterns corrected through the above-mentioned steps onto a mask substrate by an EB (electron beam) patterning apparatus or a laser beam patterning apparatus.

In this way, the mask pattern correction method according to the first embodiment divides an exposure shot area defined on a mask into sub-areas and corrects patterns in each sub-area in consideration of a pattern density in the sub-area. The pattern density is a critical factor not only for the optical proximity effect occurring in a resist exposing process but also for the thinning and thickening of wafer patterns occurring in exposing and etching processes. Using pattern correction data optimized for a give pattern density can cope with the influence of actual photolithography processes and improve a mask pattern correction accuracy.

According to the first embodiment, any or only one of the rule-based correction and simulation-based correction is achievable as a computer program. The rule-based correction involves a smaller data quantity than the simulation-based correction, and therefore, is capable of processing mask patterns quicker than the simulation-based correction. Although the simulation-based correction involves a slower processing speed than the rule-based correction, it realizes more accurate correction than the latter. It is preferable to select one of the correction techniques depending on a required pattern accuracy.

Second Embodiment

A mask pattern correction method according to the second embodiment will be explained. The second embodiment corrects mask patterns in consideration of pattern densities like the first embodiment. The second embodiment differs from the first embodiment in the way of dividing an exposure shot area into sub-areas. The first embodiment divides an exposure shot area into uniform sub-areas. On the other hand, the second embodiment defines sub-areas based on circuit blocks, and therefore, involves sub-areas of different sizes.

Figure 9A:
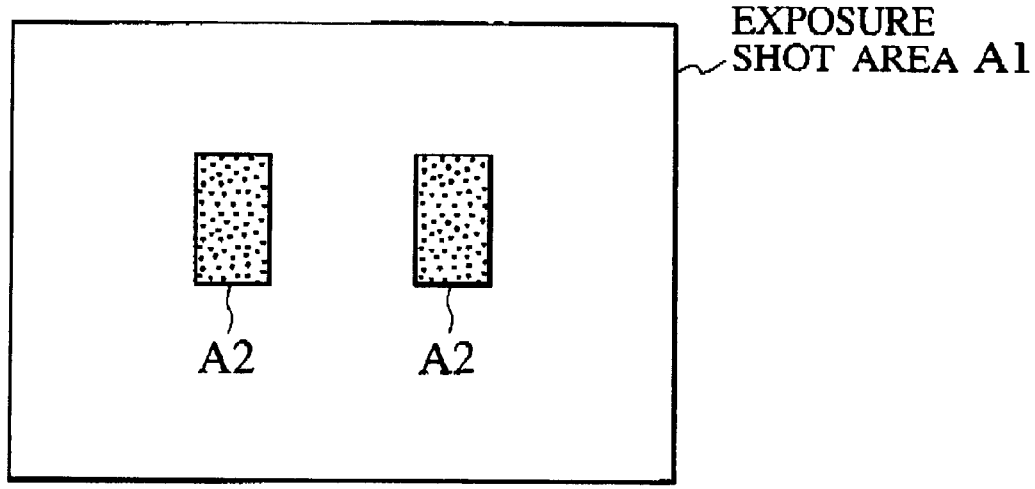
FIG. 9A is a plan view showing discrete two areas in an exposure shot area, the two areas containing patterns that require high accuracy and are corrected by a mask pattern correction method according to a second embodiment of the present invention.
Figure 9B:
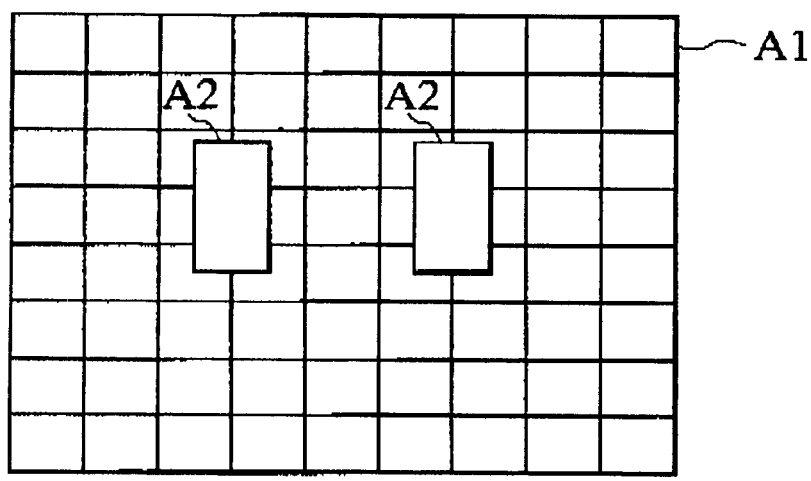
FIG. 9B is a plan view showing sub-areas divided from the exposure shot area of FIG. 9A according to the second embodiment.

FIGS. 9A and 9B show a technique of dividing an exposure shot area into sub-areas according to the second embodiment. Generally, patterns formed on a wafer involve different densities depending on circuit blocks.

For example, a memory cell area has a higher pattern density than a peripheral area. A logic area requires a high pattern accuracy, and a power source area does not always require a high pattern accuracy.

In FIG. 9A, discrete areas each requiring a high pattern accuracy are divided as sub-areas A2 from an exposure shot area A1. Only in the sub-areas A2, mask patterns are corrected according to pattern densities like the first embodiment for the remaining part of the exposure shot area A1, no pattern correction is carried out, or conventional pattern correction is carried out, or uniform pattern correction is carried out over the exposure shot area A1 based on correction data determined according to the pattern density in the sub-areas A2.

In this way, the second embodiment corrects patterns only in sub-areas that require a high pattern accuracy, to improve pattern correction efficiency. The second embodiment may correct patterns in an entire exposure shot area according to a pattern density in a circuit block requiring a highest accuracy. This avoids pattern density calculations to be made on the whole area, and at the same time, can form patterns of required accuracy on a wafer.

FIG. 10 is a flowchart showing rule-based correction according to the second embodiment this example corrects patterns in the whole of an exposure shot area defined on a mask according to correction conditions applied to a specific circuit block requiring a highest pattern accuracy in the exposure shot area. Step S201 reads design patterns to be contained in the whole of a given shot area defined on a mask. Step S202 specifies a circuit block requiring a highest pattern accuracy in the exposure shot area. Step S203 calculates a density of patterns in the specified circuit block. Step S204 retrieves a correction data table corresponding to the calculated pattern density from rule-based correction tables stored in a memory. According to the retrieved correction data table, step S205 determines each correction quantity applied to each design pattern in the exposure shot area. According to the determined correction quantities, step S206 corrects the patterns in the exposure shot area and provides corrected mask patterns. The corrected mask patterns may be recorded in a memory, if necessary.

The flowchart of FIG. 10 may employ simulation-based correction instead of the rule-based correction.

Third Embodiment

A pattern correction method according to the third embodiment will be explained. The third embodiment corrects mask patterns in consideration of pattern densities like the first embodiment. The third embodiment is characterized by defining at least one sub-area around a correction target sub-area and assigns a weight to a correction quantity of each sub-area.

Figure 11:
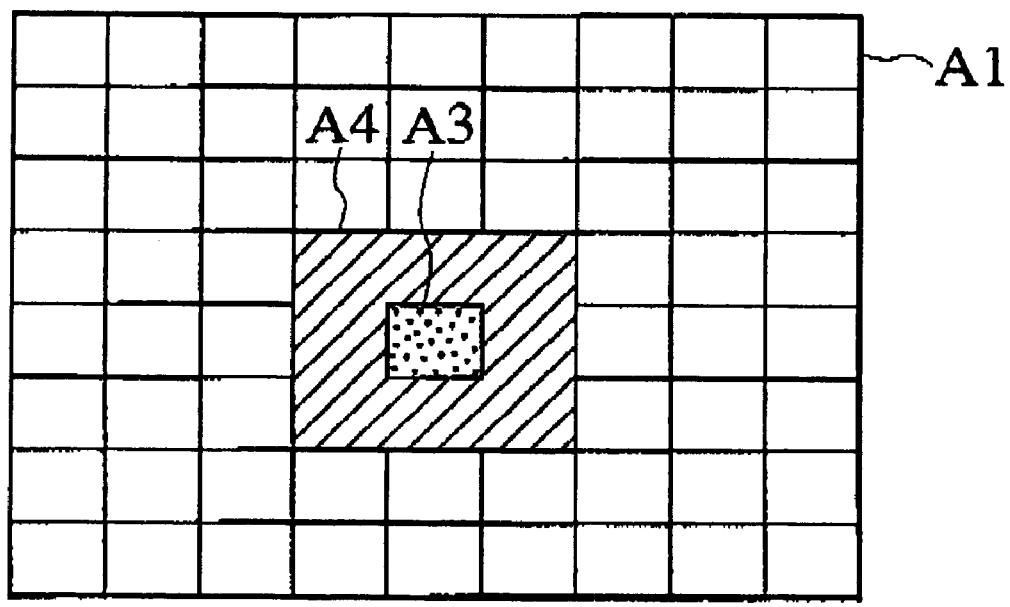
FIG. 11 is a plan view showing a correction target area and a peripheral area to be corrected by a mask pattern correction method according to a third embodiment of the present invention.

FIG. 11 shows a correction target sub-area A3 and a peripheral area A4 made of sub-areas surrounding the sub-area A3. The sub-area A3 has a pattern density of, for example, 20%, and the peripheral area A4 has a pattern density of, for example, 50%. A correction quantity retrieved from a correction data table corresponding to the pattern density in the sub-area A3 is provided with a weight of 80%, and a correction quantity retrieved for the peripheral area A4 is provided with a weight of 20%. Thereafter, patterns in the areas A3 and A4 are corrected accordingly.

According to the third embodiment, a correction target sub-area may doubly or triply surrounded with peripheral areas to which different weights are applied. In this case, the sum of the weights must be 100%. Any pattern actually formed on a wafer is affected not only by a pattern density in a correction target sub-area but also by a pattern density in peripheral sub-areas around the correction target sub-area. Weighting related sub-areas and correcting peripheral sub-areas as well are effective to improve the accuracy of mask pattern correction.

Correction steps of the third embodiment are substantially the same as those of the first embodiment. According to the third embodiment, step S5 of FIG. 7 calculates a density of design patterns in the sub-area "n" as well as a density of design patterns in a peripheral area surrounding the sub-area n. Thereafter, an effective pattern density employed for pattern correction is calculated as follows:

$$Peff = (Pam \times Wam) + (Psur \times Wsur) \qquad (1)$$

where Peff is the effective pattern density used to determine correction quantities, Pam is the pattern density in the correction target sub-area (n), Wam is a weight applied to the correction target sub-area, Psur is the pattern density in the peripheral area, and Wsur is a weight applied to the peripheral area.

For example, an effective pattern density for the case mentioned above is calculated as follows:

$$Peff = (20\% \times 0.8) + (50\% \times 0.2) = 26\%$$

The weights are determined so that the corrected mask patterns may form patterns as designed on a wafer.

As explained above, the mask pattern correction method according to any one of the embodiments corrects mask patterns based on pattern densities and forms patterns as accurately as designed on a wafer through photolithography processes including exposing, developing, and etching processes.

The mask pattern correction method according to any one of the embodiments is applicable to photomasks used to form various semiconductor circuit patterns. In particular, the present invention is effective to correct patterns to be formed on photomasks that are used to form precision gate patterns.

Additional advantages and modifications of the present invention will readily occur to those skilled in the art. Therefore, the present invention in its broader aspects is not limited to the specific details and representative embodiments shown and described herein.

What is claimed is:

1. A method of correcting mask patterns, comprising:
preparing pattern density-based correction data according to differences between mask patterns and patterns actually formed on a wafer by photolithography using the mask patterns;
obtaining design patterns for a correction target area defined on a mask;
calculating a density of the design patterns for the correction target area;
retrieving correction data corresponding to the calculated density from the prepared pattern density-based correction data; and
correcting the design patterns for the correction target area according to the retrieved correction data.

2. The method according to claim 1, wherein:
the preparing pattern density-based correction data step comprises finding relationships between pattern-topattern distances and the sizes of test patterns of a given pattern density formed on a wafer, obtaining correction quantities related to pattern-to-pattern distances according to the found relationships, and arranging the obtained correction quantities and pattern-to-pattern distances in a correction data table for the given pattern density.

3. The method according to claim 1, wherein:

the preparing pattern density-based correction data step comprises finding simulation parameters to calculate pattern correction quantities, according to pattern-to-pattern distances and simulation conditions suitable for simulating patterns of a given pattern density to be formed on a wafer, and arranging the found simulation parameters as the pattern density-based correction data.

4. The method according to claim 1, wherein:

the correction target area is one of at least two sub-areas divided from an exposure shot area defined on the mask.

5. The method according to claim 4, wherein:

the site of each of the sub-areas is in the range of 100 micrometers square to 1000 micrometers square.

6. The method according to claim 4, wherein:

the sub-areas are formed by evenly dividing the exposure shot area.

7. The method according to claim 4, wherein:

the sub-areas are discrete circuit blocks.

8. A method of correcting mask patterns, comprising:

preparing pattern density-based correction data according to differences between mask patterns and patterns actually formed on a wafer by photolithography using the mask patterns;

obtaining design patterns for an exposure shot area defined on a mask;

calculating a density of design patterns for a discrete circuit block requiring a highest pattern size accuracy in the exposure shot area;

retrieving correction data corresponding to the calculated density from the prepared pattern density-based correction data; and correcting the design patterns for the exposure shot area according to the retrieved correction data.

9. The method according to claim 8, wherein:

the preparing pattern density-based correction data step comprises finding relationships between pattern-to-pattern distances and the sizes of test patterns of a given pattern density formed on a wafer, obtaining correction quantities related to pattern-to-pattern distances according to the found relationships, and arranging the obtained correction quantities and pattern-to-pattern distances in a correction data table for the given pattern density.

10. The method according to claim 8, wherein:

the preparing pattern density-based correction data step comprises finding simulation parameters to calculate pattern correction quantities, according to pattern-to-pattern distances and simulation conditions suitable for simulating patterns of a given pattern density to be formed on a wafer, and arranging the found simulation parameters as the pattern density-based correction data.

11. A method of correcting mask patterns, comprising:

preparing pattern density-based correction data according to differences between mask patterns and patterns actually formed on a wafer by photolithography using the mask patterns;

obtaining design patterns for a correction target area defined on a mask and design patterns for a peripheral area defined around the correction target area;

calculating a density of the design patterns for the correction target area and a density of the design patterns for the peripheral area;

calculating an effective pattern density for the correction target area according to the calculated two densities;

retrieving correction data corresponding to the effective pattern density from the prepared pattern density-based correction data; and correcting the design patterns for the correction target area according to the retrieved correction data.

12. The method according to claim 11, wherein:

the effective pattern density is determined by assigning weights to the calculated two densities, respectively, multiplying the two densities by the respective weights, to provide products, and calculating the sum of the products as the effective pattern density.

13. The method according to claim 11, wherein:

the preparing pattern density-based correction data step comprises finding relationships between pattern-to-pattern distances and the sizes of test patterns of a given pattern density formed on a wafer, obtaining correction quantities related to pattern-to-pattern distances according to the found relationships, and arranging the obtained correction quantities and pattern-to-pattern distances in a correction data table for the given pattern density.

14. The method according to claim 11, wherein:

the preparing pattern density-based correction data step comprises finding simulation parameters to calculate pattern correction quantities, according to pattern-to-pattern distances and simulation conditions suitable for simulating patterns of a given pattern density to be formed on a wafer, and arranging the found simulation parameters as the pattern density-based correction data.

15. A photomask produced according to the method of claim 1.

16. A photomask produced according to the method of claim 8.

17. A photomask produced according to the method of claim 11.

18. A computer-readable memory storing a program for executing a method of correcting mask patterns, the program comprising:

reading design patterns for a correction target area defined on a mask;

calculating a density of the design patterns for the correction target area;

retrieving correction data corresponding to the calculated density from pattern density-based correction data prepared in advance according to differences between mask patterns and patterns actually formed on a wafer by photolithography using the mask patterns; and correcting the design patterns for the correction target area according to the retrieved correction data.

19. The computer-readable memory according to claim 18, wherein:

the pattern density-based correction data is obtained by finding relationships between pattern-to-pattern distances and the sizes of test patterns of a given pattern density formed on a wafer, obtaining correction quantities related to pattern-to-pattern distances according to the found relationships, and arranging the obtained correction quantities and pattern-to-pattern distances in a correction data table for the given pattern density.

20. The computer-readable memory according to claim 1, wherein:

the pattern density-based correction data is prepared by finding simulation parameters to calculate pattern correction quantities, according to pattern-to-pattern distances and simulation conditions suitable for simulating patterns of a given density to be formed on a wafer, and arranging the found simulation parameters as the pattern density-based correction data.

21. The computer-readable memory according to claim 18, wherein:

the correction target area is one of at least two sub-areas divided from an exposure shot area defined on the mask.

22. The computer-readable memory according to claim 21, wherein:

the sub-areas are formed by evenly dividing the exposure shot area.

23. The computer-readable memory according to claim 21, wherein:

the sub-areas are discrete circuit blocks.

24. A computer-readable memory storing a program for executing a method of correcting mask patterns, the program comprising:

reading design patterns for a correction target area defined on a mask;

calculating a density of design patterns for a circuit block requiring a highest pattern accuracy in the correction target area;

retrieving correction data corresponding to the calculated density from pattern density-based correction data prepared in advance according to differences between mask patterns and patterns actually formed on a wafer by photolithography using the mask patterns; and correcting the design patterns for the correction target area according to the retrieved correction data.

25. The computer-readable memory according to claim 24, wherein:

the pattern density-based correction data is obtained by finding relationships between pattern-to-pattern distances and the sizes of test patterns of a given pattern density formed on a wafer, obtaining correction quantities related to pattern-to-pattern distances according to the found relationships, and arranging the obtained correction quantities and pattern-to-pattern distances in a correction data table for the given pattern density.

26. The computer-readable memory according to claim 24, wherein:

the pattern density-based correction data is obtained by finding simulation parameters to calculate pattern correction quantities, according to pattern-to-pattern distances and simulation conditions suitable for simulating patterns of a given pattern density to be formed on a wafer, and arranging the found simulation parameters as the pattern density-based correction data.

27. A computer-readable memory storing a program for executing a method of correcting mask patterns, the program comprising:

obtaining design patterns for a correction target area defined on a mask and design patterns for a peripheral area defined around the correction target area;

calculating a density of the design patterns for the correction target area and a density of the design patterns for the peripheral area;

calculating an effective pattern density for the correction target area according to the calculated two densities;

retrieving correction data corresponding to the effective pattern density from pattern density-based correction data prepared in advance according to differences between mask patterns and patterns actually formed on a wafer by photolithography using the mask patterns; and correcting the design patterns for the correction target area according to the retrieved correction data.

28. The computer-readable memory according to claim 27, wherein:

the effective pattern density is determined by assigning weights to the calculated two densities, respectively, multiplying the two densities by the respective weights, to provide products, and calculating the sum of the products as the effective pattern density.

29. The computer-readable memory according to claim 27, wherein:

the pattern density-based correction data is obtained by finding relationships between pattern-to-pattern distances and the sizes of test patterns of a given pattern density formed on a wafer, obtaining correction quantities related to pattern-to-pattern distances according to the found relationships, and arranging the obtained correction quantities and pattern-to-pattern distances in a correction data table for the given pattern density.

30. The computer-readable memory according to claim 27, wherein:

the pattern density-based correction data is obtained by finding simulation parameters to calculate pattern correction quantities, according to pattern-to-pattern distances and simulation conditions suitable for simulating patterns of a given density to be formed on a wafer, and arranging the found simulation parameters as the pattern density-based correction data.

* * * * *